(12) United States Patent
Agrawal et al.

(10) Patent No.: US 9,058,438 B2
(45) Date of Patent: Jun. 16, 2015

(54) APPLICATION-REQUIREMENT BASED CONFIGURATION DESIGNER FOR DISTRIBUTED COMPUTING SYSTEMS

(75) Inventors: Dakshi Agrawal, Monsey, NY (US); Chatschik Bisdikian, Chappaqua, NY (US); Seraphin Bernard Calo, Cortlandt Manor, NY (US); Murthy V. Devarakonda, Peekskill, NY (US); David Alson George, Somers, NY (US); Sandeep K. Gopisetty, Morgan Hill, CA (US); Kang-Won Lee, Nanuet, NY (US); Konstantinos Magoutis, New York, NY (US); Ramani Ranjan Routray, San Jose, CA (US); Gauri Shah, Santa Clara, CA (US); Chung-hao Tan, San Jose, CA (US); Norbert George Vogl, Mahopac, NY (US); Kaladhar Voruganti, San Jose, CA (US); Steve Richard White, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 2314 days.

(21) Appl. No.: 11/741,859

(22) Filed: Apr. 30, 2007

(65) Prior Publication Data
US 2008/0270971 A1  Oct. 30, 2008

(51) Int. Cl.
*G06F 9/44* (2006.01)
*G06F 17/50* (2006.01)

(52) U.S. Cl.
CPC .................................. *G06F 17/50* (2013.01)

(58) Field of Classification Search
USPC .................................................. 717/102, 121
See application file for complete search history.

(56) References Cited

U.S. PATENT DOCUMENTS

| | | | |
|---|---|---|---|
| 6,119,174 A | 9/2000 | Borowsky et al. | |
| 6,963,828 B1 * | 11/2005 | McDonald et al. | 703/22 |
| 7,343,410 B2 * | 3/2008 | Mercier et al. | 709/225 |
| 7,457,853 B1 * | 11/2008 | Chari et al. | 709/220 |
| 7,757,213 B2 * | 7/2010 | Fusaro et al. | 717/120 |
| 7,761,538 B2 * | 7/2010 | Lin et al. | 709/220 |
| 8,024,440 B2 * | 9/2011 | Jibbe | 709/223 |
| 2003/0005119 A1 | 1/2003 | Mercier et al. | |
| 2004/0025162 A1 | 2/2004 | Fisk | |
| 2004/0243692 A1 | 12/2004 | Arnold et al. | |
| 2007/0006218 A1 * | 1/2007 | Vinberg et al. | 717/174 |

OTHER PUBLICATIONS

E. Anderson et al., "Hippodrome: Running Circles Around Storage Administration," Conference on File and Storage Technologies (FAST), Jan. 2002, pp. 175-188, California.

(Continued)

*Primary Examiner* — Hang Pan
(74) *Attorney, Agent, or Firm* — Ryan, Mason & Lewis, LLP

(57) ABSTRACT

Techniques for automatically designing an application-requirement based configuration for a distributed computing system are provided. One or more application-level templates are obtained, wherein the one or more templates are representative of one or more requirements associated with one or more applications. Using the one or more application-level templates, one or more logical flows are created. The one or more logical flows are then used to generate one or more system-level configuration plans of the distributed computing system.

21 Claims, 7 Drawing Sheets

(56) References Cited

OTHER PUBLICATIONS

J. Ward et al., "Appia and HP SAN Designer: Automatic Storage Area Network Fabric Design," HP Technical Conference, Apr. 2003, Colorado.

E. Borowsky et al., "Capacity Planning with Phase Workloads," Proceedings of the 1st International Workshop on Software and Performance, 1998, 9 pages, New Mexico.

* cited by examiner

APPLICATION-REQUIREMENT BASED CONFIGURATION DESIGNER FOR DISTRIBUTED COMPUTING SYSTEMS

FIELD OF THE INVENTION

The present invention relates to application-requirement based configuration planning for distributed computing systems and, more particularly, to techniques for automatically generating distributed computing system configurations that comply with the application-level requirements of one or more applications to be run on the distributed computing system.

BACKGROUND OF THE INVENTION

Planning and building a distributed computing system is a challenging task due to the scale and complexity involved with the problem. For example, planning a company-wide network infrastructure requires the designers to first understand the types of applications that will be connected over the network and the impact of having different types of applications on the same network. In a more specific example, designing an enterprise-scale storage infrastructure requires an understanding of how various applications will access the storage systems (e.g., data rate, security requirement, and desired availability level). Each application may have specific system requirements and those requirements may conflict with other applications running on the same network. In reality, applications are constantly being added and removed from the network. This requires a constant re-planning and re-building of the network infrastructure.

Conventional techniques utilize a hands-on approach to handle this process. Using the networked storage design process as a concrete example, the typical task of a storage system designer is a continuous cycle of the following: (a) planning new infrastructure or extensions to the existing infrastructure in order to satisfy increasing storage demand; and (b) monitoring the data being stored as it goes through a lifecycle of allocation, backups, migration, and disposal. This process has become increasingly tedious and time consuming because network applications have become more complex and resource driven.

Outside of the storage infrastructure context, there has been a general need for an automated network planning method. Unfortunately, existing network tools have provided inflexible and limited solutions. For example, existing tools fail to fully address application requirements in their planning methodology. Therefore, these tools still require first level human analysis. In addition, existing network tools are customized to only handle certain types of limited infrastructures. As a result, it is very difficult to use these network planning tools in conjunction with each other. For example, one cannot easily generate a plan which includes both a communications network infrastructure and a storage network infrastructure. It is also difficult to generate a plan of computer servers which will serve applications, and further plan the storage network infrastructure necessary to connect the servers to enterprise storage systems. The only two solutions are to plan each infrastructure independently or to find planners that plan for specific infrastructure combinations.

Therefore, there is a need for a flexible, automated method of network resource planning capable of addressing various infrastructures and application requirements.

SUMMARY OF THE INVENTION

Principles of the present invention provide techniques for automatically designing an application-requirement based configuration for a distributed computing system and, more particularly, techniques for generating one or more system-level configuration plans for a distributed computing system that comply with the application-level requirements of one or more applications to be run on the distributed computing system.

In accordance with one aspect of the invention, a technique for automatically designing an application-requirement based configuration for a distributed computing system is provided. One or more application-level templates are obtained, wherein the one or more templates are representative of one or more requirements associated with one or more applications. Using the one or more application-level templates, one or more logical flows are created. The one or more logical flows are then used to generate one or more system-level configuration plans of the distributed computing system.

The one or more system-level configuration plans may be in accordance with at least one of one or more distributed computing system requirements and one or more distributed computing system policies. Furthermore, the step of generating one or more system-level configuration plans may include the steps of host planning, storage planning, physical flow planning, zone planning, and network planning.

These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

As will be illustrated in detail below, principles of the present invention provide techniques for automatically designing application-requirement based configurations for distributed computing systems. More specifically, an embodiment of the present invention includes techniques for generating one or more system-level configuration plans for a distributed computing system, wherein the one or more system-level configurations comply with application-level requirements of one or more applications running on the distributed computing system. The principles of the present invention will be illustrated herein in conjunction with an exemplary technique for automatically designing application-requirement based configurations for distributed computing systems.

The term "distributed computing system" as used herein is intended to be construed broadly so as to encompass, by way of example and without limitation, any networked system (e.g., communications networks, storage networks, etc.).

The term "application-requirement" as used herein is intended to be construed broadly so as to encompass, by way of example and without limitation, any hardware, software or other related requirements of an application that are necessary for operation.

The term "application-level" as used herein is intended to be construed broadly so as to encompass, by way of example and without limitation, any specifications of hardware, software or the like that are designed to be recognized by an application.

The term "system-level" as used herein is intended to be construed broadly so as to encompass, by way of example and without limitation, any specifications of hardware, software or the like that are designed to be recognized by a distributed computing system.

A key challenge in creating system-level configurations of distributed computing systems is to coordinate and integrate various application-level and system-level design plans. Since each design plan is created for a unique purpose and specifically designed using a distinct set of requirements, integration is complex and tedious. Conventional methods require a distributed computing systems designer to manually combine the application-level and system-level design plans into one overall architectural plan. This is a key issue because any software, hardware or like changes in the distributed computing system will require constant re-construction of the architectural plans, which is time consuming and costly. Therefore, an automated method of designing architectural plans would make better use of network resources and personnel.

Figure 1:
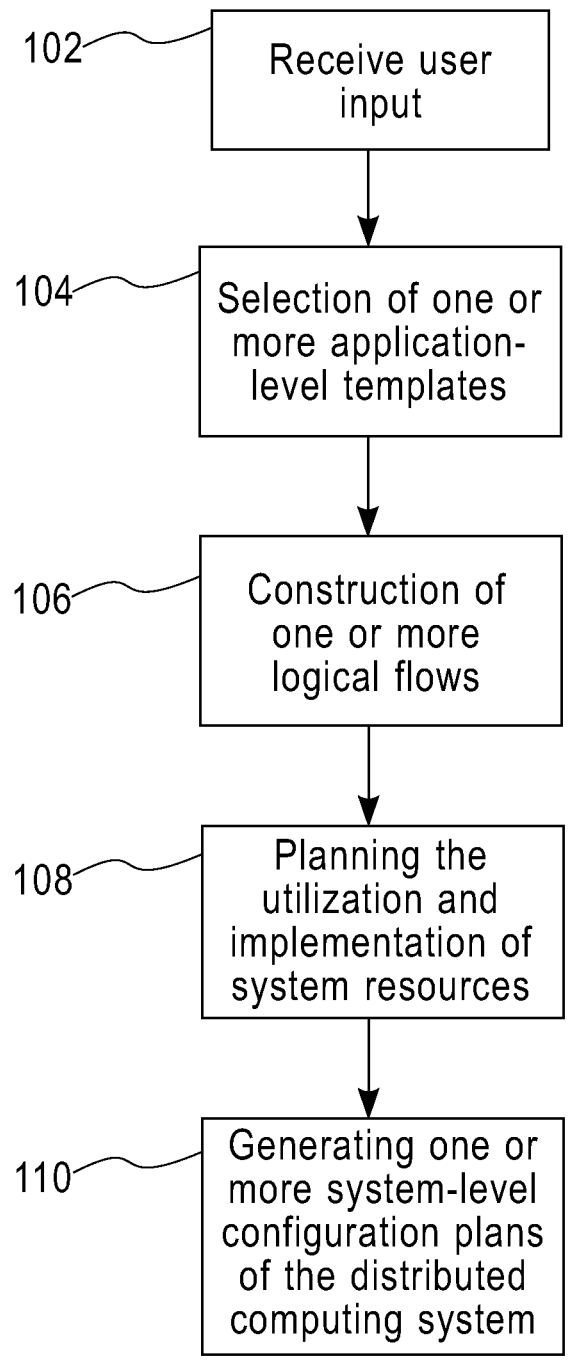
FIG. 1 is a flow diagram illustrating a methodology for automatically designing an application-requirement based configuration for a distributed computing system, according to an embodiment of the present invention.

Referring initially to FIG. 1, a flow diagram illustrates a methodology for automatically designing an application-requirement based configuration for a distributed computing system, according to an embodiment of the present invention. Methodology 100 begins in block 102 where a user inputs basic information about the applications that are to be run on the distributed computing system. In block 104, the user input is used to select one or more application-level templates. Application-level templates are prepackaged specifications that characterize the typical workload and resource requirements of an application. In block 106, these templates are then used in the construction of one or more logical flows. Each logical flow is a compiled version of the one or more application-level templates. In block 108, the logical flows are then used to plan the utilization and implementation of system resources. More specifically, the planning is accomplished via a master planner and sub-planner system. In block 110, configuration plans, in system-level format, are generated. More detailed descriptions of these blocks will be provided in the following figures.

Figure 2:
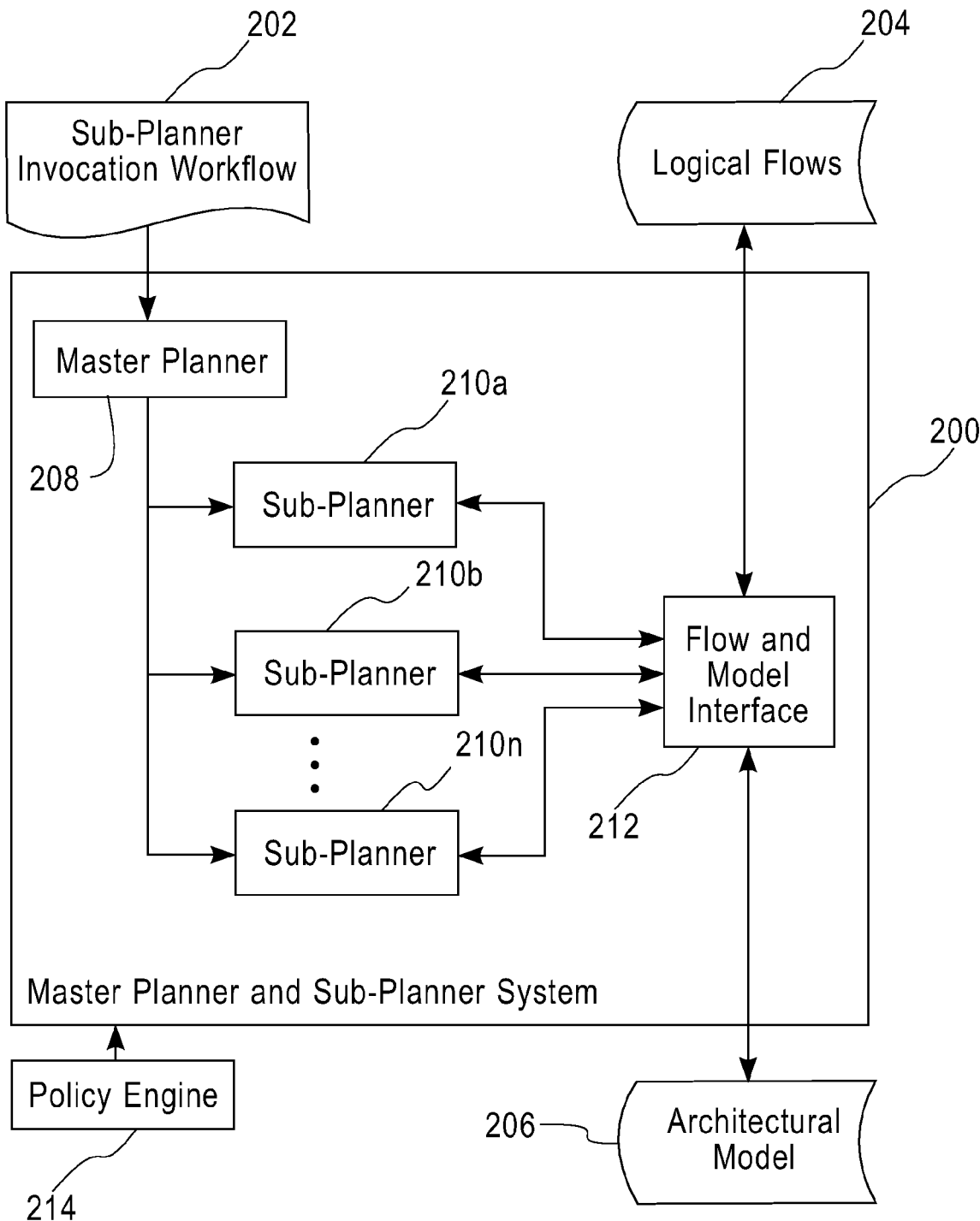
FIG. 2 is a flow diagram illustrating components of a master planner and sub-planner system, according to an embodiment of the present invention.

Referring now to FIG. 2, a flow diagram illustrates components of a master planner and sub-planner system, according to an embodiment of the present invention. The master planner and sub-planner system 200 includes a master planner, one or more sub-planners and a flow and model interface. System 200 may also connect to a policy engine 214. In block 202, the sub-planner invocation workflow is used to direct the invocations of the one or more sub-planners (e.g., 210a, 210b, 210n) via the master planner 208. The master planner controls the execution of the sub-planners based upon instructions from the sub-planner invocation workflow and, preferably, based on consultation with a policy engine. The policy engine can assist in interpreting instructions in the sub-planner invocation workflow and/or the policy engine can select a sub-planner invocation workflow from one or more candidate sub-planner invocation workflows.

During the execution of the master planner and sub-planner system, specifications are added to the data structures of the logical flows 204 and system-level configuration plans are written into the architectural model 206. At completion, the architectural model will contain a plan that conforms to the various requirements of the logical flows. Furthermore, the architectural model will document one or more implementations of the configuration plans. The architectural model is the output of the entire master planner and sub-planner system.

Within the master planner and sub-planner system, the sub-planners 210a to 210n, when executed, refer to the logical flows and develop one or more configuration plans. The sub-planners interact with the logical flows via the flow and model interface 212. Typical sub-planners include a host planner, a storage planner, a physical flow planner, a network planner, and a zone planner. Each individual plan is incorporated into the architectural model via the flow and model interface. In whole, the architectural models are configured to satisfy the requirements specified by the logical flows.

Figure 3:
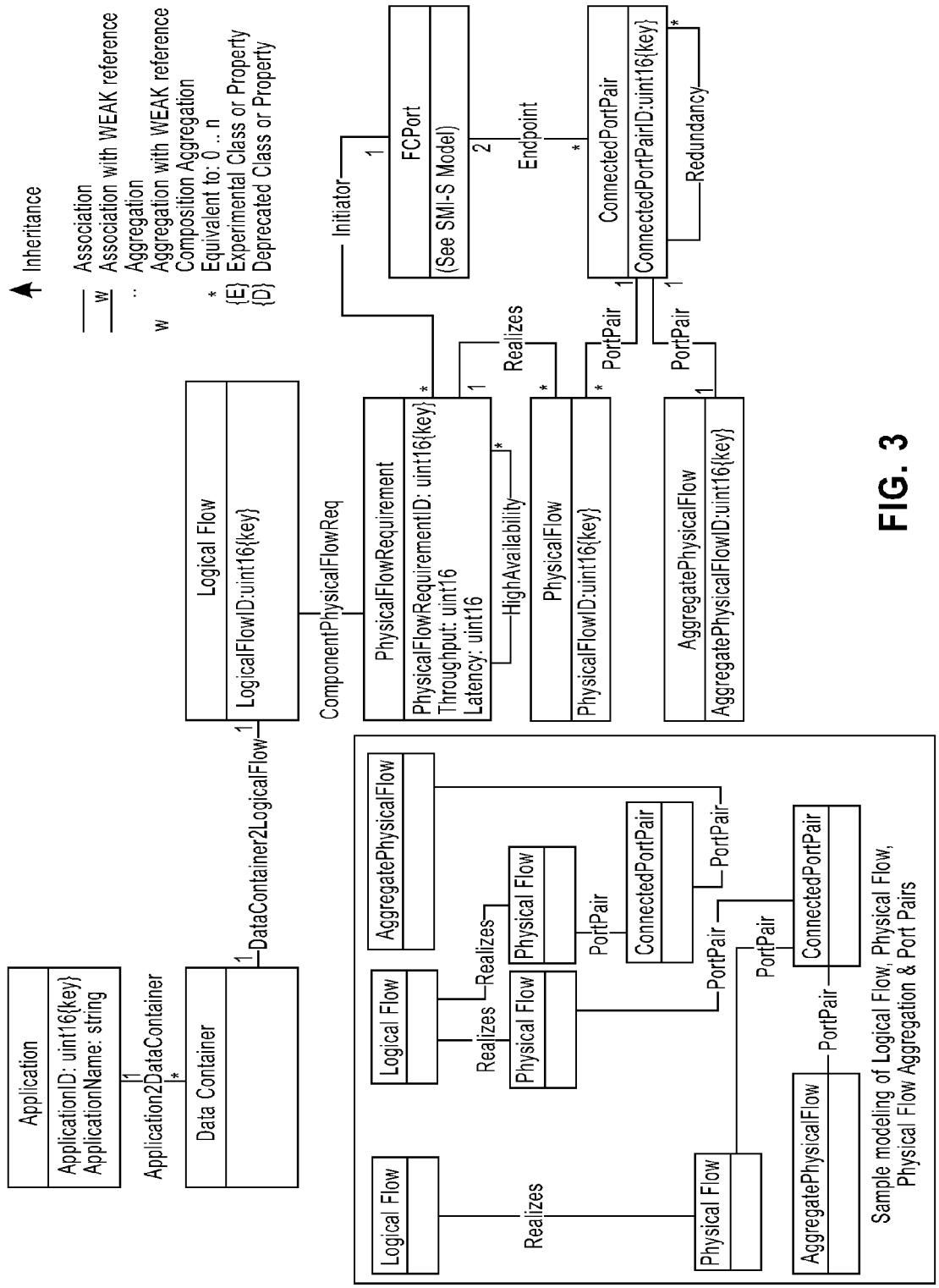
FIG. 3 is a schematic diagram illustrating a logical flow for a given example, according to an embodiment of the present invention.

Logical flows are well understood to those skilled in the art of distributed system planning. A schematic diagram illustrating an example of a logical flow can be found in FIG. 3. Architectural models are also well known to those skilled in the art of distributed system planning. An architectural model will typically contain one or more plans of a distributed system. In an embodiment of the present invention, the architectural model is encoded with the CIM (Common Information Model) data structures defined in the SNIA (Storage Networking Industry Association) standard.

In an embodiment of the present invention, both the logical flows and architectural models are stored within CIM (Common Information Model) data structures, and the flow and model interface is a CIMOM (Common Information Model Object Manager). In addition, the sub-planners perform a SAN (Storage Area Network) planning function and the architectural model describes a SAN architecture using the CIM data structures defined in SNIA standards.

The master planner and sub-planner system can be used in conjunction with software installation planners (e.g., planners that plan operating system and application software installs on computers), server physical configuration planners (e.g., planners that generate hardware and memory plans), application configuration and distribution planners (e.g., planners that generate plans indicating how applications are configured for use in clustered application servers), intranet network planners, and wide-area-network planners.

Figure 4:
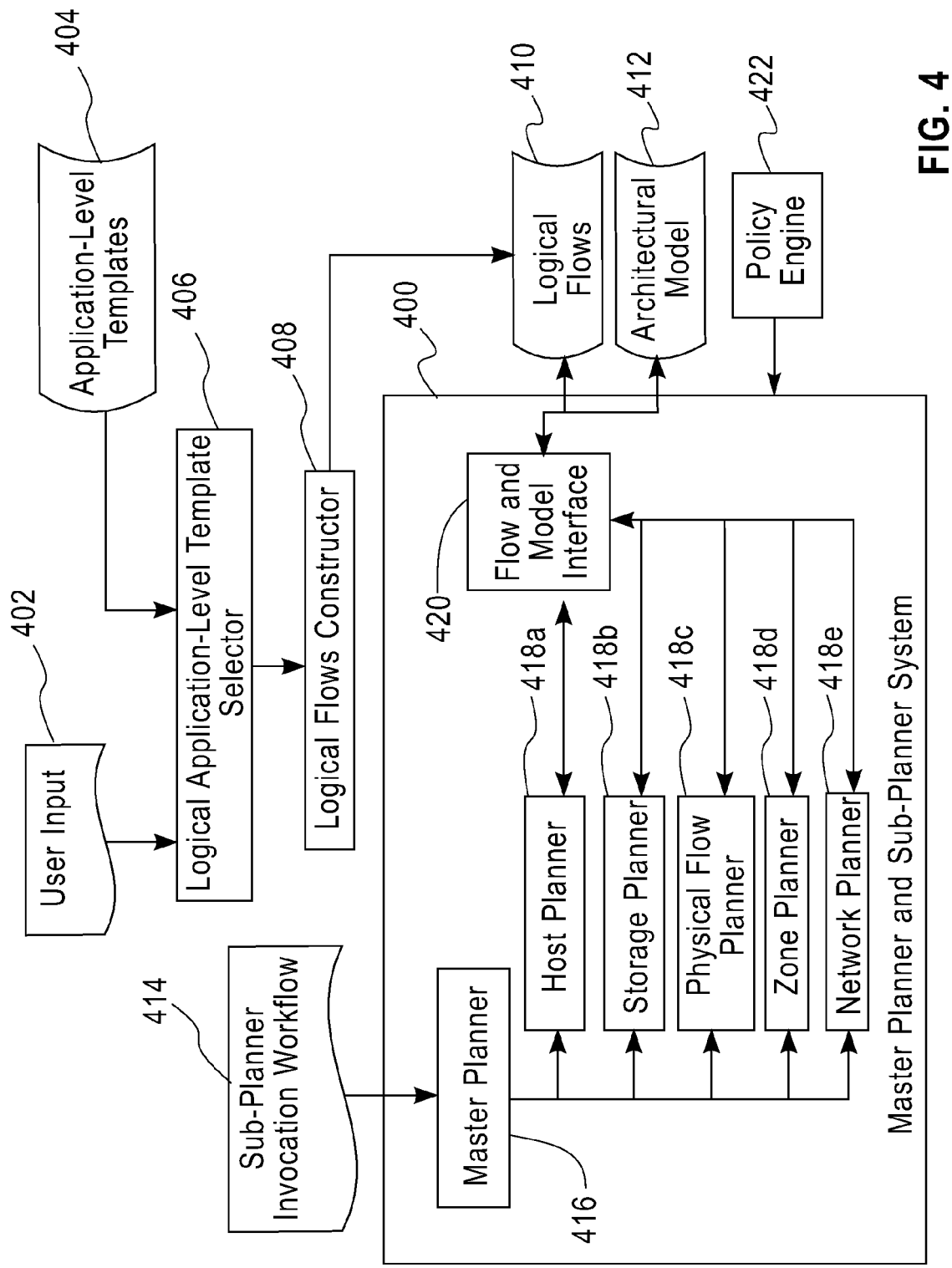
FIG. 4 is a flow diagram illustrating a master planner and sub-planner system in a storage infrastructure context, according to an embodiment of the present invention.

Referring now to FIG. 4, a flow diagram illustrates a master planner and sub-planner system in a storage infrastructure context, according to an embodiment of the present invention. A key challenge in the design of application-enabled storage designer is to consistently achieve and maintain storage requirements across all parts of large and complex distributed systems (e.g., SANs). This involves selecting logical application-level templates, constructing logical flows, and constructing storage plans that specify the construction of physical flows, allocation of storage resources, storage mapping, storage masking, and storage zoning. FIG. 4 illustrates this overall process.

In block 402, the first step is the selection of logical application-level templates. Typically, storage designers have access to a list of prepackaged logical application level templates 404. Each template characterizes the typical workload for an application and provides information about data containers and their associated storage service classes. A data container is an abstract storage unit that aggregates storage volumes that have been logically carved out of storage pools. A storage service class is an aggregation of performance, availability, backup/restore, future growth, and security attributes. A system designer can associate a storage service class to a data container. The system designer may work with already existing storage service classes or can optionally create new storage service classes. Alternatively, the system designer may profile the behavior of an application or a group of applications with the help of monitoring tools that determine an appropriate template for the applications or assist in the creation of new application templates. The logical templates are then stored in a centralized repository and the number of available templates will grow over time as more solutions are designed.

Typically, application-level templates contain: (1) a text description of the application being characterized; (2) information about host-level requirements (e.g., number and availability of host servers, number of storage network adapters); (3) a list of one or more data containers used by the application, and an association that maps each data container to a service class; and (4) information about possible inter-data container concurrency (e.g., data containers that can be accessed simultaneously).

In block 406, a system designer can choose application-level templates via a logical application-level template selector. In an embodiment of the present invention, the local application-level template selector is a graphical user interface. In alternate embodiments, the user input is passed into an application-level template selector via a text file or programming interface. The output of the local application-level templates selector is one or more application-level templates.

In block 408, the logical flow constructor constructs logical flows 410 for each planned data container. Each logical flow describes the intended use of a data container by a given application. They indicate the service class and host bus adapter (HBA) requirements of each host involved in the interaction between the application and its data container.

In block 400, the master planner and sub-planner system reads the logical flows and generates system-level storage plans (also known as an architectural model) 412 of a SAN which meets the requirements of the logical flows; therefore, the storage plans also meet the application-level requirements specified within the application-level templates. The architectural model is the output of the entire system.

In an embodiment of the present invention, the following sub-planners are employed: a host planner 418a; a storage planner 418b; a physical flow planner 418c; a zone planner 418d, and a network planner 418e. A sub-planner invocation workflow 414 is used to direct the invocations of sub-planners 418a-418e via the master planner 416. The sub-planners utilize the constructed logical flows via the flow and model interface 420. Additional distributed computing system requirements and policies can be introduced into the system by consulting the policy engine 422.

In an additional embodiment of the present invention, a future growth planner (not expressly shown) can be incorporated into the sub-planner system. A future growth planner plans for expected growth in terms of data traffic and capacity. This type of planning is important for networked storage systems. Future growth requirements can be estimated by extrapolating historical growth data, or can be obtained as an input from a human expert or storage designer. The future requirements can be used to modify the bandwidth and capacity parameters of an application template. For example, if the bandwidth is expected to grow by 50% over the next three years, the bandwidth parameter in the template must be modified accordingly. Future growth information can also be incorporated during device planning. In particular, device expansion capability in terms of number of slots, ports, and power.

Note that during the process of planning, the sub-planners may also take online/offline resources into consideration. For instance, an inventory manager and a catalog manager are in the planning loop to feed current inventory data to the sub-planners. A system designer has the ability to select existing resources and/or choose new types of resources from the device catalog, which contains device information necessary for planning.

Figure 5:
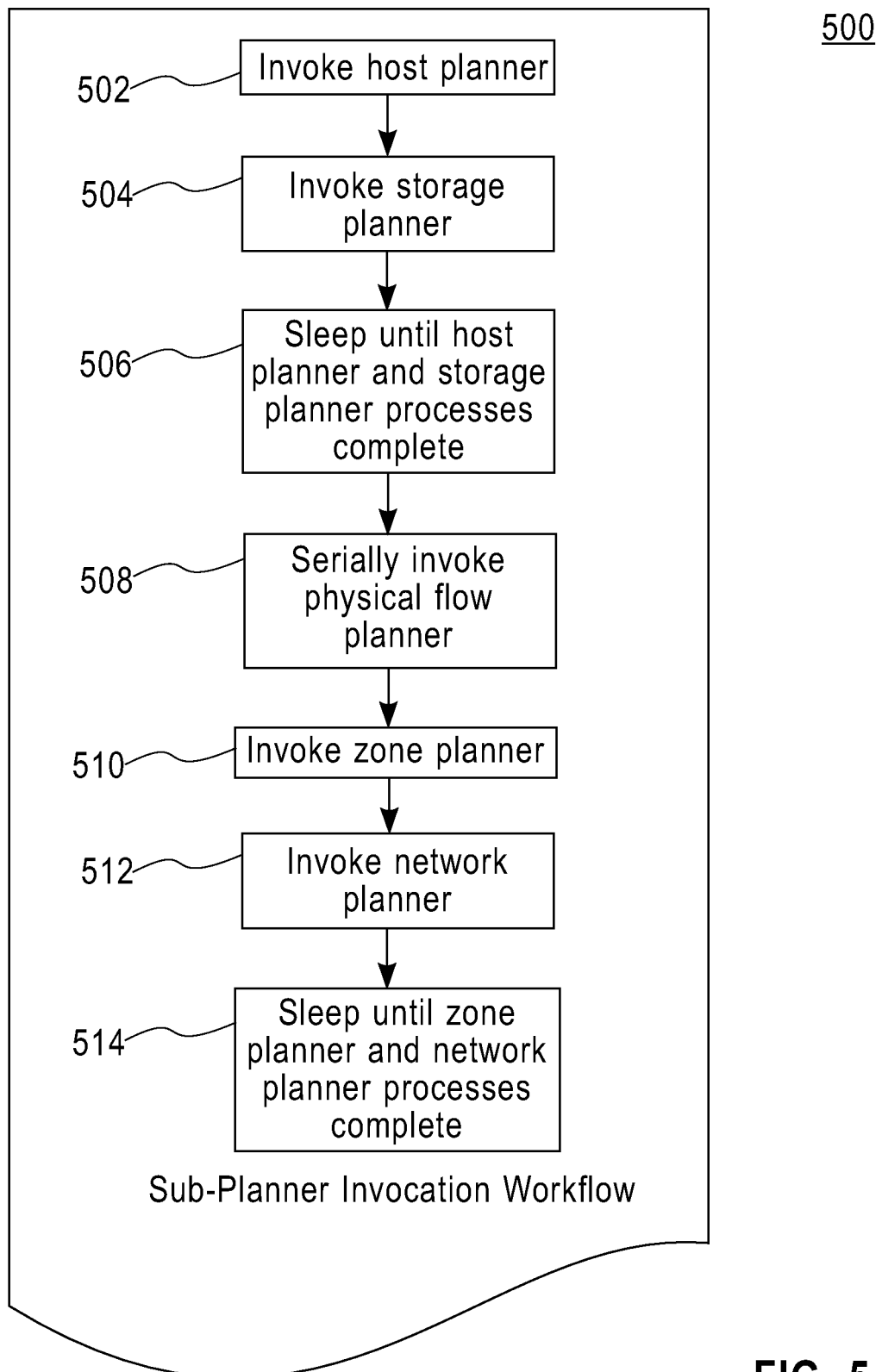
FIG. 5 is a flow diagram illustrating a sub-planner invocation workflow for a given example, according to an embodiment of the present invention.

Referring now to FIG. 5, a flow diagram illustrates a sub-planner invocation workflow 500 for the storage infrastructure example, according to an embodiment of the present invention. Methodology 500 begins in block 502 where the master planner invokes host planner 418a in response to a sub-planner invocation workflow. The host planner is a sub-planner that will allocate any computer equipment needed to host the applications referenced by the logical flows 410. The host planner may also make use of existing equipment within the architectural model 412. In block 504, the master planner invokes storage planner 418b. The storage planner is a sub-planner that allocates storage devices according to the demands of the logical flows. Typically, the processes of host planning and storage planning are done independently. In an embodiment of the present invention, sub-planner invocation workflows can invoke the planners serially or in parallel, and in any order.

In block 506, the master planner invokes a sleep instruction until both the host planner and storage planner have completed their planning operations. Once a storage infrastructure has been planned, each logical flow is associated with one or more physical flows. In block 508, physical flow sub-planner 418c is serially invoked. Each physical flow connects the end-points of an actual data path through the storage infrastructure. A host will use this data path to access the storage associated with the data containers of applications. Each physical flow corresponds to a particular host machine, a particular port on the host, a storage controller, and a port on the controller.

In an embodiment of the present invention, physical flow construction can be accomplished in four sub-steps. The first sub-step is the planning of host bus adaptors (HBAs)/ports of the host. Given the number of hosts that will be in the design, the planner will decide how many HBAs/ports are necessary to carry out the requested throughput; the planner maps the logical throughput requirements to multiple host ports. In addition to the throughput requirement, the need to sustain failures without performance degradation will necessitate additional redundancy. Appropriate service class attributes express these redundancy characteristics. The redundancy requirement to hide failure may be categorized as follows: (1) tolerate up to a single failure without performance degradation; (2) tolerate up to a single failure without data unavailability, but with possible performance degradation; and (3) resource failure may lead to data unavailability, i.e., no redundancy.

The second sub-step in the physical flow construction process is the planning of storage controller ports. Based on the results of the first sub-step, the planner will decide which controller ports should be utilized. Similar to the host HBAs/ports planning, this sub-step will select the appropriate number of redundant controller ports based on throughput and redundancy requirements. After this step, physical flows are constructed by matching host ports to storage controller ports.

The third sub-step is used to decide which storage volume can be accessed by which physical flow. Each host planner port instance in a physical flow maps to a volume container, which may potentially break into multiple LUN (logical unit number) on more than one controller; therefore, multiple physical paths.

The forth sub-step is the allocation of storage resources. An embodiment of the present invention uses the physical flow information together with service class specifications found in each logical application-level template, to allocate suitable physical resources (e.g., HBA, switch, storage sub-system, etc.) into the plans.

In block 510, zone planner 418d is invoked. The zone planner constructs the storage mapping, LUN masking, and fabric zoning plans within the architectural model. Storage mapping involves plotting the sections of the storage infrastructure for the purposes of access. Zoning is a network-layer access control mechanism that dictates which storage subsystems are visible to hosts. This access control mechanism is useful in scenarios where the storage area network is shared across multiple administrative or functional domains, and secure access is a concern. Zoning is predominantly a function that is provided by the switch hardware. The concept of LUN masking is an additional fine-grained security layer above zoning that provides servers with the ability to segment the LUNs that are not required by the server, LUN masking is primarily accomplished at the HBA driver level as well as at the storage controller level. As a result, masking can be done once at the storage subsystem level or every time a host accesses a storage subsystem.

System designers can implement a variety of different zoning policies via a policy engine. These policies can be tailored to specific applications so that the storage access boundaries between applications are not crossed. Zoning guidance policies include: (1) granularity of zones: one zone per application; one zone per host; one zone per storage array; one zone per data container; one zone per data path between a server and a storage array; (2) device type: one zone per device type; one zone per specific device; and (3) groups of devices: one zone per group of devices; one zone per cluster of servers associated with an application. In addition to guidance policies, it is also possible to have validation policies such as: (1) size: a minimum of M elements and a maximum of N elements per zone; any element can be a member of at most N zones; a maximum of N zones per fabric; and (2) exceptions: disallow server X and storage array Y from being in the same zone; disallow tape and disk devices from being in the same zone. LUN mapping/masking can also have guidance policies such as, hosts in shared-disk applications have identical mapping/masking views. LUN mapping/masking validation policies include: (1) LUN numbers are contiguous, starting from zero; and (2) a maximum of M LUNs can be assigned to a host.

In block 512, the master planner invokes network planner 418e. The network planner is a sub-planner which inserts network equipment and device interconnection specifications into the architectural model. The network planner generates a plan that meets the specifications of the logical flows and requirements placed in the architectural model by the physical flow planner. In block 514, the master planner waits until the zone planner and network planner complete their respective executions. When the zone planner and network planner processes have been completed, the master planner stops reading the sub-planner invocation workflow and terminates.

Figure 6:
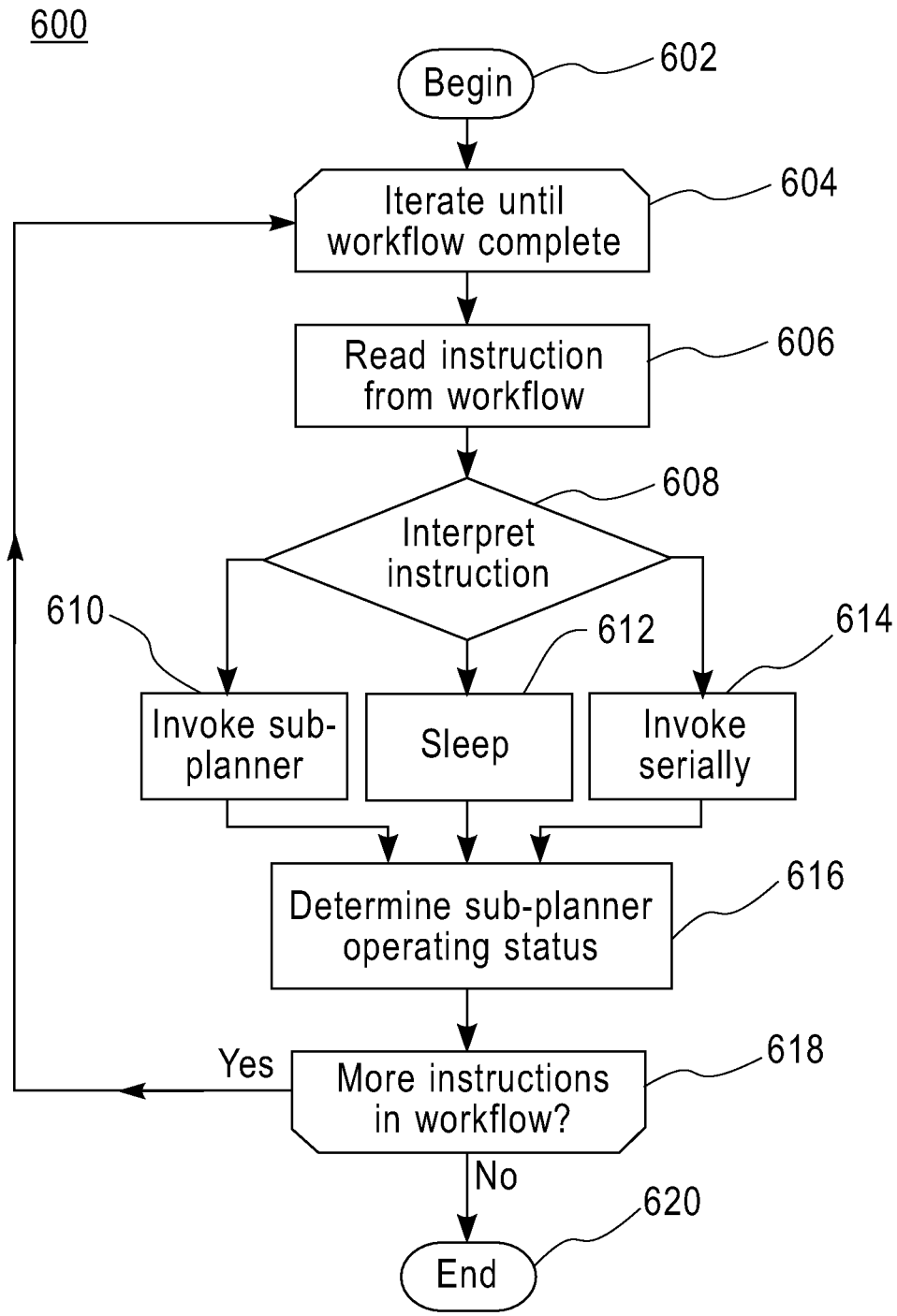
FIG. 6 is a flow diagram illustrating the methodology of a master planner for a given example, according to an embodiment of the present invention.

Referring now to FIG. 6, a flow diagram 600 illustrates the methodology of a master planner for the storage infrastructure example, according to an embodiment of the present invention. Methodology 600 begins in block 602 where the master planner begins execution. In block 604, the master planner begins iterating through a sub-planner invocation workflow. In block 606, the master planner reads an instruction from the workflow. In block 608, the master planner interprets the instruction. In an embodiment of the present invention, master planner operations can include: invoking a sub-planner 610; executing a sleep instruction 612; and serially invoking sub-planners 614. Upon receiving an "invoke sub-planner" instruction, the master planner causes a designated sub-planner to begin execution. Upon receiving a "sleep" instruction, the system sleeps until a specified period of time elapses or one or more designated sub-planners have completed their execution. Upon receiving an "invoke serially" instruction, the master planner causes a designated sub-planner to begin execution and the system sleeps until the sub-planner process completes. In an additional embodiment of the present invention, the "invoke serially" instruction may be implemented as an in-line invocation (e.g., sub-routine call).

In block 616, the master planner determines the execution status of previously invoked sub-planners. In an embodiment of the present invention, sub-planners are invoked serially through a call-return mechanism and both the sleep and determine sub-planner operating status steps are omitted. In block 618, the master planner examines the workflow for additional steps. If there are additional steps, the process repeats. When the workflow steps are exhausted, the master planner ends 620.

Figure 7:
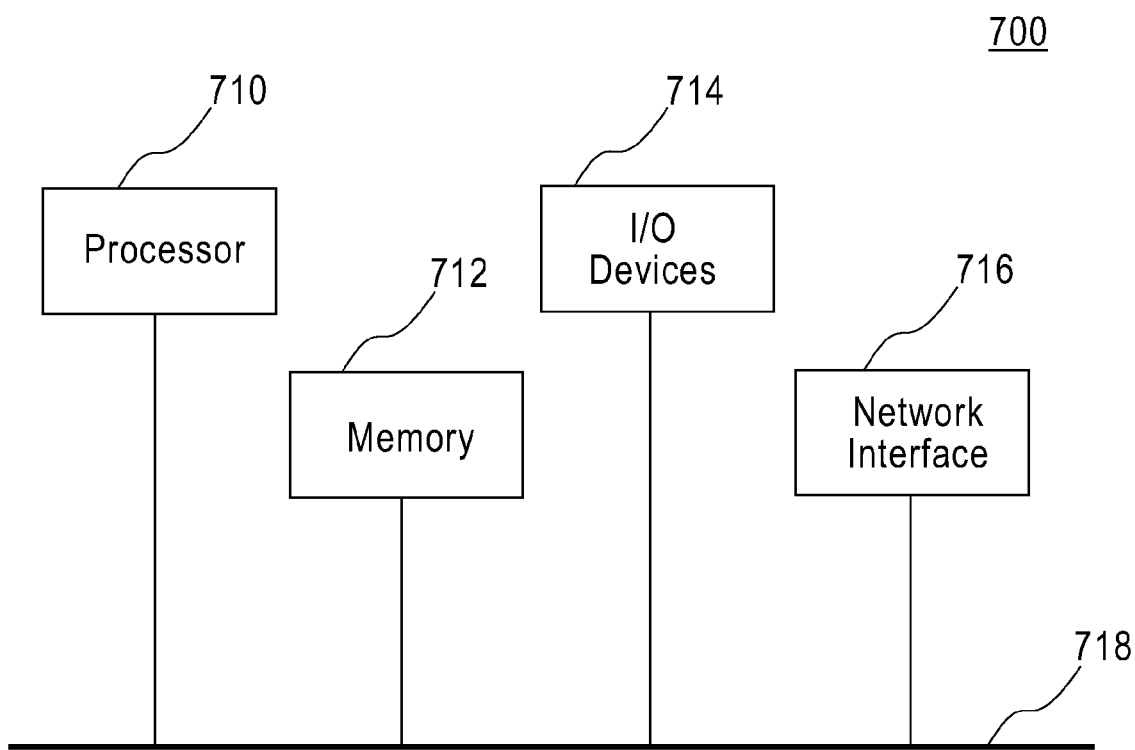
FIG. 7 is a diagram illustrating an illustrative hardware implementation of a computing system in accordance with which one or more components/methodologies of the present invention may be implemented, according to an embodiment of the present invention.

Referring now to FIG. 7, block diagram 700 illustrates an exemplary hardware implementation of a computing system in accordance with which one or more components/methodologies of the invention (e.g., components/methodologies described in the context of FIGS. 1-6) may be implemented, according to an embodiment of the present invention.

As shown, the techniques for automatically designing an application-requirement based configuration for a distributed computing system may be implemented in accordance with a processor 710, a memory 712, I/O devices 714, and a network interface 716, coupled via a computer bus 718 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

Still further, the phrase "network interface" as used herein is intended to include, for example, one or more transceivers to permit the computer system to communicate with another computer system via an appropriate communications protocol.

Software components including instructions or code for performing the methodologies described herein may be stored in one or more of the associated memory devices (e.g., ROM, fixed or removable memory) and, when ready to be utilized, loaded in part or in whole (e.g., into RAM) and executed by a CPU.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method of automatically designing an application-requirement based configuration for a distributed computing system comprising the steps of:
    obtaining one or more application-level templates, wherein each of the one or more application-level templates comprises a description of a given application, a list of one or more data containers used by the given application and storage service classes associated with respective ones of the one or more data containers;
    creating one or more logical flows using the one or more application-level templates, each of the logical flows describing an intended use of a given one of the data containers used by the given application; and
    generating one or more system-level configuration plans of the distributed computing system using the one or more logical flows, wherein the one or more system-level configuration plans comprise an architectural model of a storage area network which meets requirements of the one or more logical flows;
    wherein the one or more logical flows are created automatically;
    wherein the step of generating one or more system-level configuration plans further comprises the steps of at least one of host planning, storage planning, physical flow planning, zone planning, and network planning; and
    wherein the step of physical flow planning further comprises the steps of:
        evaluating one or more host bus adapters and one or more ports, in accordance with at least one of one or more throughput requirements and one or more redundancy requirements;
        planning one or more physical connections between the one or more applications and one or more network controller ports, in accordance with at least one of one or more throughput requirements and one or more load balancing requirements;
        verifying resource accessibility of the distributed computing system via the one or more planned physical connections; and
        allocating one or more distributed computing system resources to the one or more host systems.

2. The method as recited in claim 1, wherein an application-level template comprises at least one of a text description of the application, one or more host-level requirements, and container concurrency information.

3. The method as recited in claim 1, wherein the one or more logical flows comply with the one or more application requirements of the one or more application-level templates.

4. The method as recited in claim 1, wherein the step of generating one or more system-level configuration plans are in accordance with at least one of one or more distributed computing system requirements and one or more distributed computing system policies.

5. The method as recited in claim 1, wherein the one or more planning steps are invoked serially or in parallel.

6. The method as recited in claim 1, wherein the step of host planning further comprises the step of allocating one or more computer components required to host the one or more applications.

7. The method as recited in claim 1, wherein the step of storage planning further comprises the step of allocating one or more storage devices required by the one or more applications.

8. The method as recited in claim 1, wherein the step of zone planning further comprises the steps of at least one of distributed computing system resource mapping, logical unit number (LUN) masking, and fabric zoning.

9. The method as recited in claim 1, wherein the step of network planning further comprises the step of inserting distributed computing system device interconnections into the one or more system-level configuration plans.

10. The method of claim 1, wherein the step of obtaining one or more application-level templates comprises: estimating one or more future requirements associated with the one or more applications; and modifying the one or more application-level templates based at least in part on the one or more future requirements.

11. The method of claim 10, wherein the one or more future requirements are determined based at least in part on historical growth data.

12. The method of claim 10, wherein the one or more future requirements are determined based at least in part on input from a user.

13. An apparatus for automatically designing an application-requirement based configuration for a distributed computing system, the apparatus comprising:
    a memory; and
    at least one processor coupled to the memory and programmed with instructions to: (i) obtain one or more application-level templates, wherein each of the one or more application-level templates comprises a description of a given application, a list of one or more data containers used by the given application and storage service classes associated with respective ones of the one or more data containers; (ii) create one or more logical flows using the one or more application-level templates, each of the logical flows describing an intended use of a given one of the data containers used by the given application; and (iii) generate one or more system-level configuration plans of the distributed computing system using the one or more logical flows, wherein the one or more system-level configuration plans comprise an architectural model of a storage area network which meets requirements of the one or more logical flows;
    wherein the one or more logical flows are created automatically;
    wherein the operation of generating one or more system-level configuration plans further comprises performing at least one of host planning, storage planning, physical flow planning, zone planning, and network planning; and
    wherein to perform physical flow planning, the processor is further programmed with instructions to:

evaluate one or more host bus adapters and one or more ports, in accordance with at least one of one or more throughput requirements and one or more redundancy requirements;

plan one or more physical connections between the one or more applications and one or more network controller ports, in accordance with at least one of one or more throughput requirements and one or more load balancing requirements;

verify resource accessibility of the distributed computing system via the one or more planned physical connections; and allocate one or more distributed computing system resources to the one or more host systems.

14. The apparatus as recited in claim 13, wherein to perform host planning, the processor is further programmed with instructions to allocate one or more computer components required to host the one or more applications.

15. The apparatus as recited in claim 13, wherein to perform storage planning, the processor is further programmed with instructions to allocate one or more storage devices required by the one or more applications.

16. The apparatus as recited in claim 13, wherein to perform zone planning, the processor is further programmed with instructions to perform at least one of distributed computing system resource mapping, logical unit number (LUN) masking, and fabric zoning.

17. The apparatus as recited in claim 13, wherein to perform network planning, the processor is further programmed with instructions to insert distributed computing system device interconnections into the one or more system-level configuration plans.

18. An article of manufacture for automatically designing an application-requirement based configuration for a distributed computing system, the article comprising a non-transitory computer readable storage medium containing one or more computer programs, which when executed implement the steps of:

obtaining one or more application-level templates, wherein each of the one or more application-level templates comprises a description of a given application, a list of one or more data containers used by the given application and storage service classes associated with respective ones of the one or more data containers;

creating one or more logical flows using the one or more application-level templates, each of the logical flows describing an intended use of a given one of the data containers used by the given application; and generating one or more system-level configuration plans of the distributed computing system using the one or more logical flows, wherein the one or more system-level configuration plans comprise an architectural model of a storage area network which meets requirements of the one or more logical flows;

wherein the one or more logical flows are created automatically;

wherein the step of generating one or more system-level configuration plans further comprises the steps of at least one of host planning, storage planning, physical flow planning, zone planning, and network planning; and wherein the step of physical flow planning further comprises the steps of:

evaluating one or more host bus adapters and one or more ports, in accordance with at least one of one or more throughput requirements and one or more redundancy requirements;

planning one or more physical connections between the one or more applications and one or more network controller ports, in accordance with at least one of one or more throughput requirements and one or more load balancing requirements;

verifying resource accessibility of the distributed computing system via the one or more planned physical connections; and allocating one or more distributed computing system resources to the one or more host systems.

19. The article of manufacture of claim 18, wherein:

the step of host planning further comprises the step of allocating one or more computer components required to host the one or more applications;

the step of storage planning further comprises the step of allocating one or more storage devices required by the one or more applications;

the step of zone planning further comprises the steps of at least one of distributed computing system resource mapping, logical unit number (LUN) masking, and fabric zoning; and the step of network planning further comprises the step of inserting distributed computing system device interconnections into the one or more system-level configuration plans.

20. A method of automatically designing application-requirement based configurations for networked storage systems comprising the steps of:

obtaining one or more application-level templates, wherein each of the one or more application-level templates comprises a description of a given application, a list of one or more data containers used by the given application and storage service classes associated with respective ones of the one or more data containers;

creating one or more logical flows using the one or more application-level templates, each of the logical flows describing an intended use of a given one of the data containers used by the given application;

planning networked storage system utilization via a master planner, one or more sub-planners, a flow and model interface, and the one or more created logical flows, wherein the master planner processes planning instructions from one or more workflows, and the one or more sub-planners further comprise a host planner, storage planner, physical flow planner, zone planner, and network planner; and generating one or more system-level storage configurations of a distributed computing system using the results of the planning step, wherein the one or more system-level configuration plans comprise an architectural model of a storage area network which meets requirements of the one or more logical flows;

wherein the one or more logical flows are created automatically; and wherein the physical flow planner is configured to:

evaluate one or more host bus adapters and one or more ports, in accordance with at least one of one or more throughput requirements and one or more redundancy requirements;

plan one or more physical connections between the one or more applications and one or more network controller ports, in accordance with at least one of one or more throughput requirements and one or more load balancing requirements;

verify resource accessibility of the distributed computing system via the one or more planned physical connections; and allocate one or more distributed computing system resources to the one or more host systems.

21. The method of claim 20, wherein:

the host planner is configured to allocate one or more computer components required to host the one or more applications;

the storage planner is configured to allocate one or more storage devices required by the one or more applications;

the zone planner is configured to perform at least one of distributed computing system resource mapping, logical unit number (LUN) masking, and fabric zoning; and the network planner is configured to insert distributed computing system device interconnections into the one or more system-level configuration plans.

* * * * *